United States Patent [19]

Diggs

[11] 4,187,123
[45] Feb. 5, 1980

[54] DIRECTIONALLY CONTROLLED ARRAY OF SOLAR POWER UNITS

[76] Inventor: Richard E. Diggs, 12 A Rd., Carthage, Mo. 64836

[21] Appl. No.: 851,718

[22] Filed: Nov. 15, 1977

Related U.S. Application Data

[63] Continuation of Ser. No. 624,396, Oct. 21, 1975, abandoned.

[51] Int. Cl.² .......................................... H01L 31/04
[52] U.S. Cl. ..................................... 136/206; 60/641; 126/425; 126/440; 136/89 PC
[58] Field of Search ..................... 290/2; 126/270, 271; 60/641; 136/89 PC

[56] References Cited

U.S. PATENT DOCUMENTS

| | | | |
|---|---|---|---|
| 3,965,683 | 6/1976 | Dix | 60/641 |
| 3,976,508 | 8/1976 | Mlavsky | 60/641 |

FOREIGN PATENT DOCUMENTS 909092 11/1945 France ................................. 126/271

Primary Examiner—J. V. Truhe
Assistant Examiner—Eugene S. Indyk
Attorney, Agent, or Firm—Shoemaker and Mattare, Ltd.

[57] ABSTRACT

A directionally controlled array of solar power units includes a supporting frame having conduits for flow of hot and cold water to each of the units supported on the frame, and each unit includes a solar cell which directly converts solar energy into electrical energy, the solar energy being concentrated on the cells by lenses. The solar cells are electrically connected for desired use of the electrical energy produced thereby, and the hot and cold water conduits are connected with the cells for flow of cold water in heat exchange relationship with the cells to cool the cells and heat the water and the hot water is available for work. Thermocouples and controls are connected with the units for moving the units to keep them pointed at the sun to thus utilize maximum energy therefrom throughout daylight hours.

8 Claims, 9 Drawing Figures

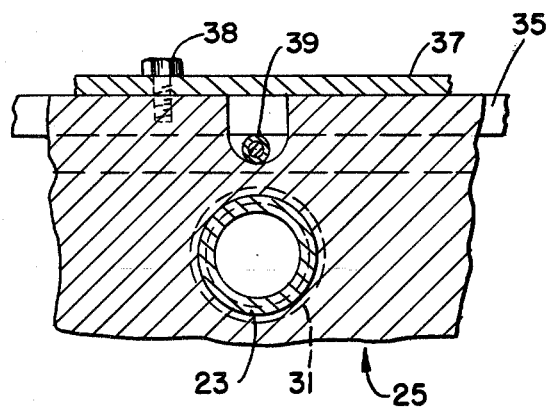
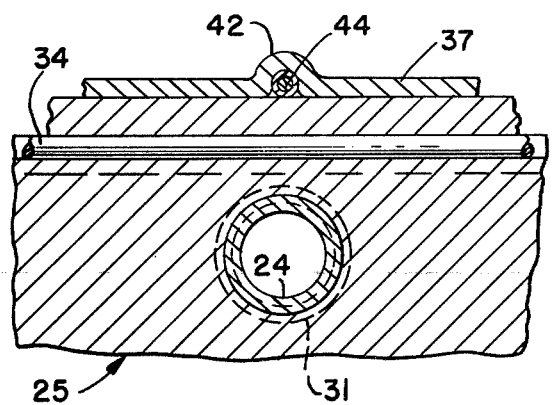
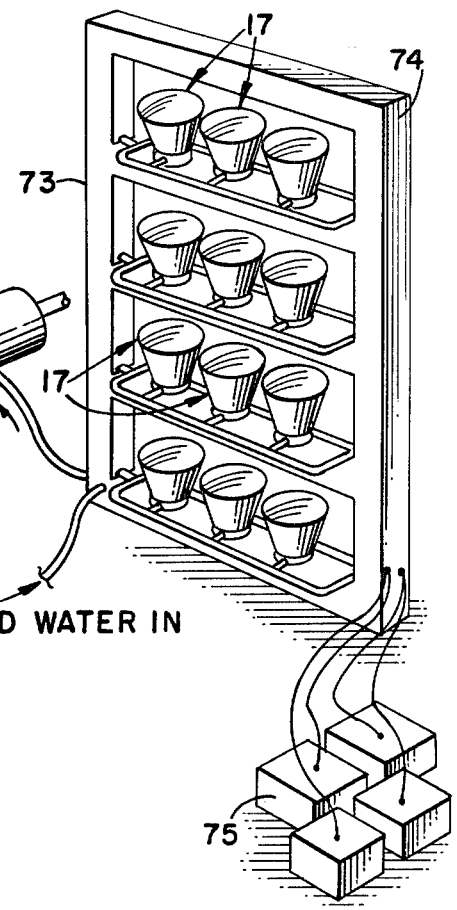
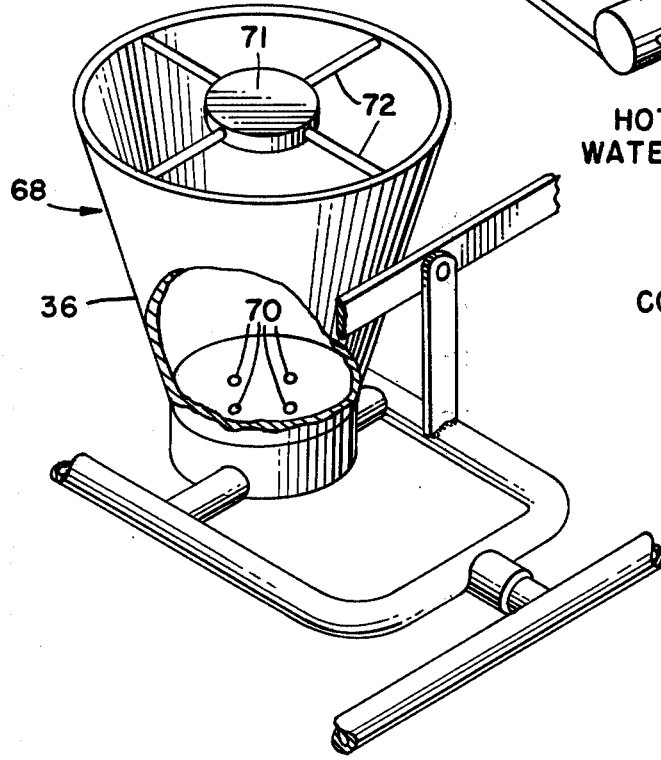

DIRECTIONALLY CONTROLLED ARRAY OF SOLAR POWER UNITS

This is a continuation, of application Ser. No. 624,396, filed Oct. 21, 1975 now abandoned.

BACKGROUND OF THE INVENTION

This invention relates to a solar powered means for producing work, and more particularly, relates to such a device which utilizes solar cells for direct conversion of solar energy into electrical energy and also utilizes water circulated in heat exchange relationship with the solar cells to both cool the solar cells and heat the water, whereby the heated water may be used for work.

Specifically, in accordance with the invention, control means are connected with the power units, whereby the power units may be pivoted to maintain them pointed at the sun during daylight hours to thus maximize the amount of solar energy impinging upon the solar cells.

Many devices are known in the prior art for utilizing solar energy to produce work, as exemplified, for example, in some of the U.S. Pat. Nos. listed below:

No. 696,326—De La Garza—Mar. 25, 1902
No. 811,274—A. Carter—Jan. 30, 1906
No. 895,761—F. M. Huntoon—Aug. 11, 1908
No. 1,599,481—A. Marcuse—Sept. 14, 1926
No. 1,658,455—H. Metzech, et al—Feb. 7, 1928
No. 2,552,237—F. Trombe—May 8, 1951
No. 2,946,945—N. J. Regnier, et al—July 26, 1960
No. 3,231,426—F. A. Ludwig, et al—Jan. 25, 1966
No. 3,232,795—R. B. Gillette, et al—Feb. 1, 1966

The prior art devices either do not provide a means for keeping the solar power unit pointed at the sun during daylight hours, or they are excessively complicated and expensive in construction, or they are not energy efficient and thus are not entirely suitable for use.

The present invention solves the problems extant in the prior art by providing a device which utilizes an array of solar power units, each of which has a solar cell therein for directly converting the sun's energy into electrical energy and which also has means for circulation of water in heat exchange relationship with the solar cell to both cool the solar cell and also to produce hot water and/or steam which may then be utilized for work. Control means are connected with the power units for pivoting the power units to maintain them pointed at the sun during hours of daylight to maximize the use of the sun's energy.

OBJECTS OF THE INVENTION

Accordingly, it is an object of this invention to provide a directionally controlled array of solar power units, which has means for directly converting the sun's energy into electrical energy and which also has means for simultaneously heating water to thus obtain work therefrom.

Another object of the invention is to provide a directionally controlled array of solar power units which are pivotally supported and are pivotally moved in response to the position of the sun to maintain the units pointed at the sun during hours of daylight to maximize utilization of the sun's energy.

A still further object is to provide a solar power means which utilizes a plurality of solar power units each having a solar cell and a lens for concentrating solar energy on the solar cell, and means for circulating water in heat exchange relationship with the solar cell to heat the water.

Yet another object of the invention is to provide a directionally controlled array of solar power units which is simple and economical in construction and accurate in operation and which is exceptionally energy efficient.

BRIEF DESCRIPTION OF THE DRAWINGS

FIG. 6 is a greatly enlarged, fragmentary view in section taken along line 6—6 in FIG. 4.

FIG. 7 is a greatly enlarged, fragmentary view in section taken along line 7—7 in FIG. 4.

FIG. 8 is a fragmentary, perspective view of a portion of the control means for controlling the position of the solar power units.

FIG. 9 is a perspective view of a modification of the invention, wherein the solar power units are arranged in a vertically oriented array.

DETAILED DESCRIPTION OF THE PREFERRED EMBODIMENT

Figure 1:
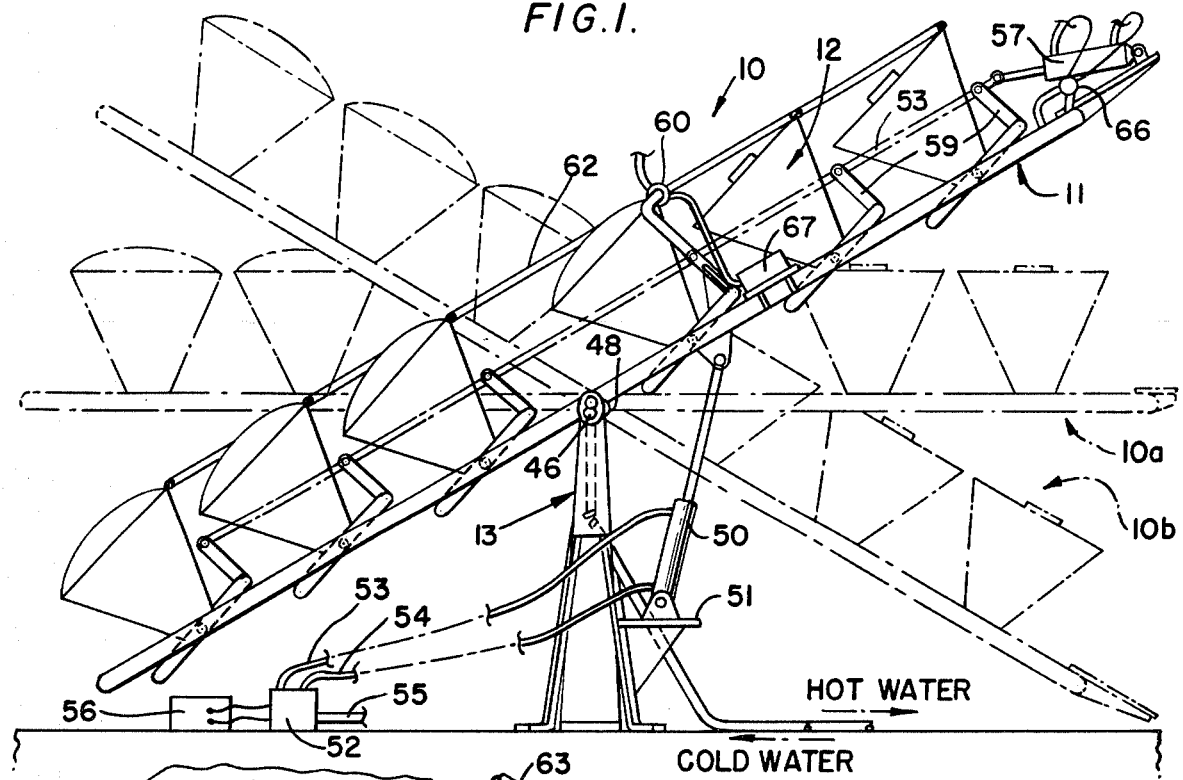
FIG. 1 is a view in elevation of a directionally controlled array of solar power units according to the invention, with the array shown in one of its positions in full lines and in two of its other positions in phantom lines.
Figure 2:
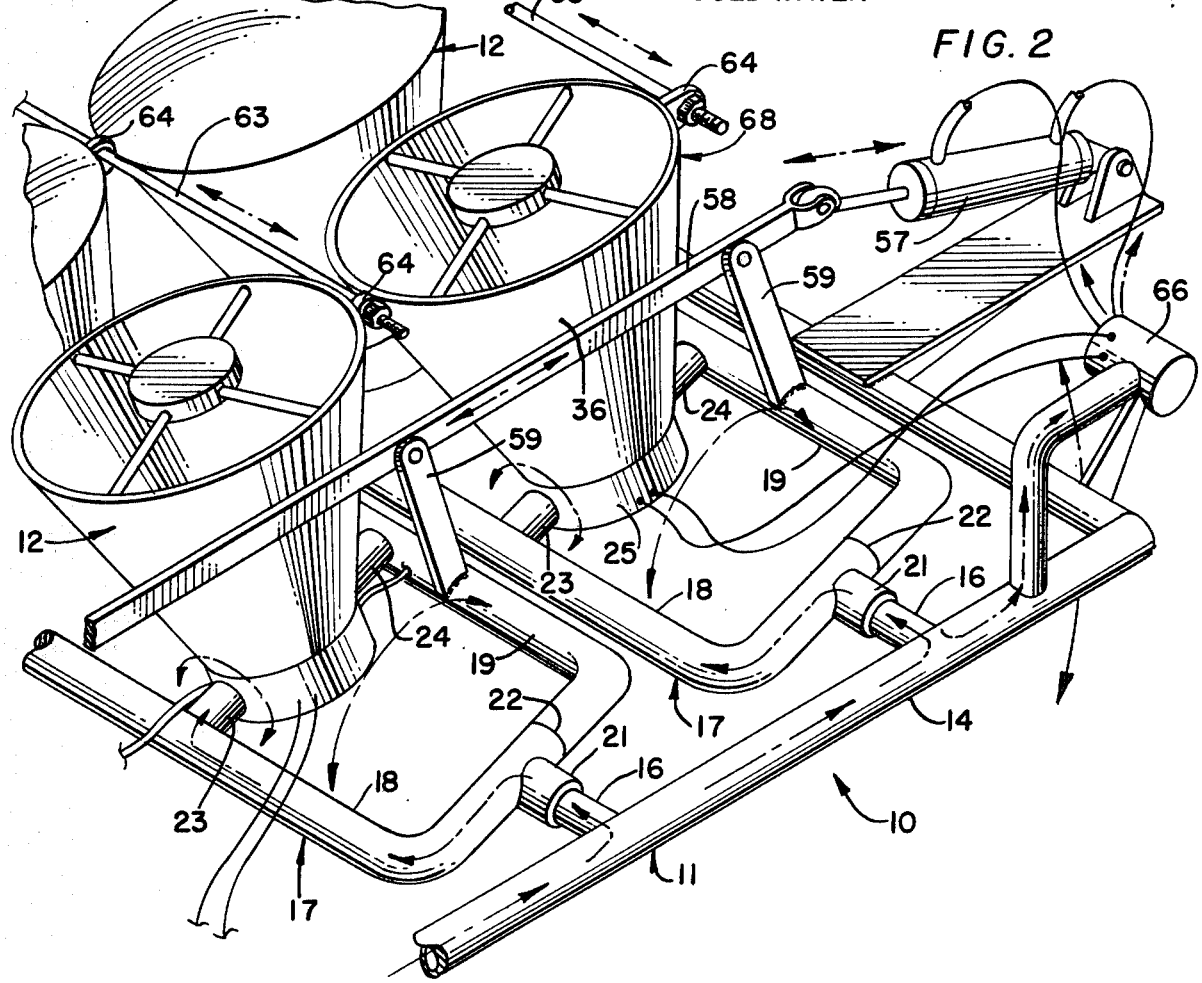
FIG. 2 is a greatly enlarged, fragmentary, perspective view of a portion of the apparatus of FIG. 1, showing a portion of the control means for pivoting the power units about a plurality of axes to maintain them pointed at the sun during hours of daylight.
Figure 3:
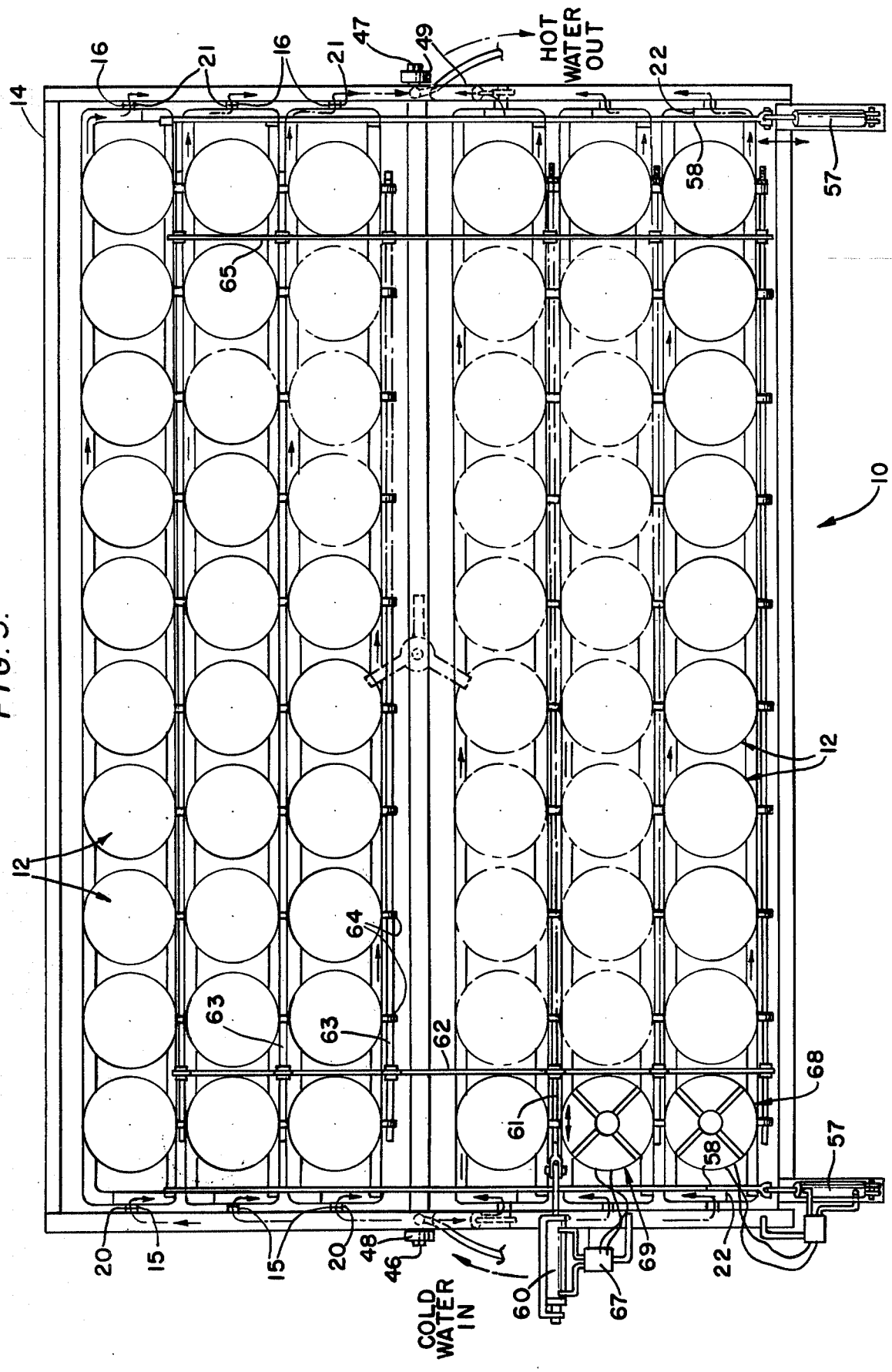
FIG. 3 is a plan view of a directionally powered array of solar power units as shown in FIG. 1.
Figure 4:
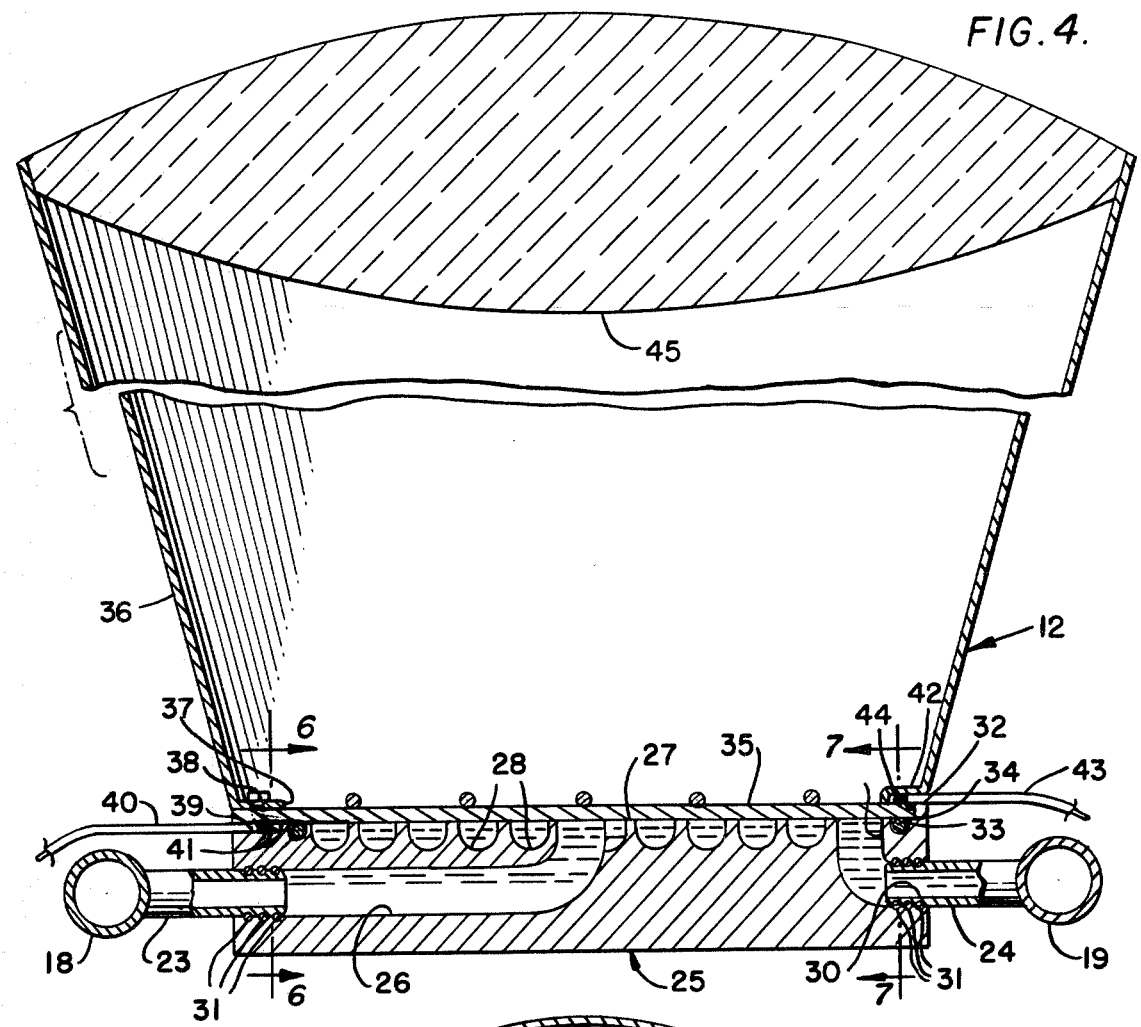
FIG. 4 is a greatly enlarged, fragmentary, sectional view of one of the power units of the invention.
Figure 5:
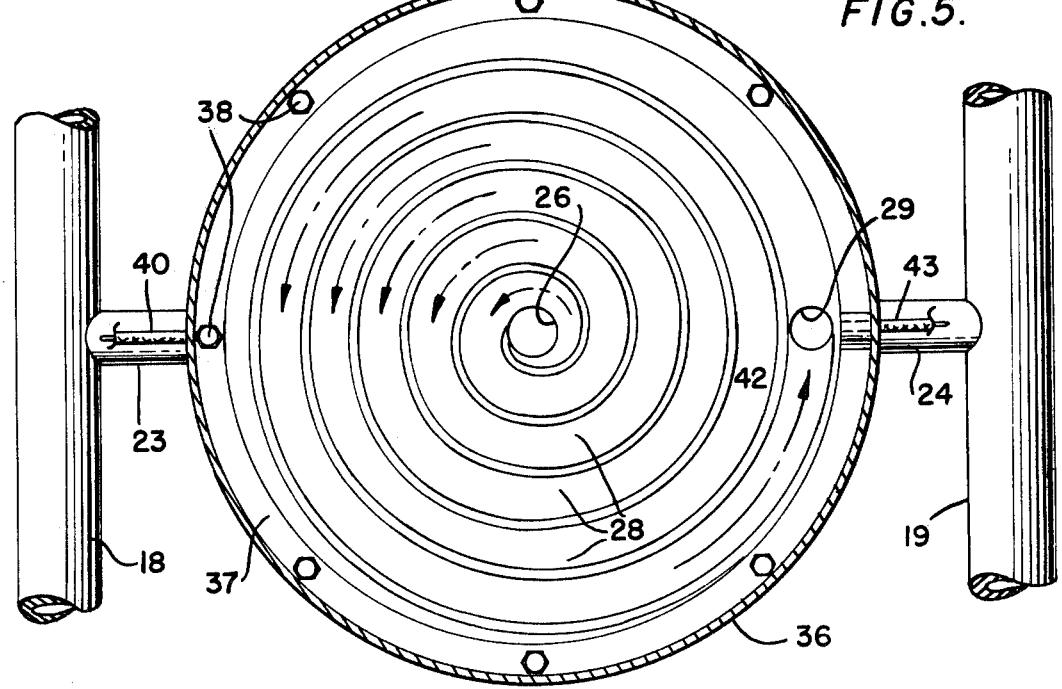
FIG. 5 is a view in section taken along line 5—5 of FIG. 4.

In the drawings, wherein like reference numerals indicate like parts throughout the several views, a directionally controlled array of solar power units is indicated generally at 10 in FIG. 1 and comprises a pivoted supporting frame 11 on which a plurality of solar power units 12 are pivotally mounted. The frame 11 is supported for pivotal movement on a base or uprights 13. The frame 11 in the embodiment shown comprises a plurality of pipes or conduits connected together to form a peripheral frame portion 14 having a plurality of outwardly extending nipples or fittings 15 and 16 along opposite ends thereof, respectively. Elongate, generally rectangularly shaped water manifolds 17 comprising a cold water supply pipe 18 and a parallel, spaced hot water pipe 19 converge at their opposite ends and have outwardly extending bosses 20 and 21 thereon engaged on the fittings 15 and 16, respectively. The bosses 20 and 21 are rotatable upon the fittings 15 and 16 and are sealed relative thereto by means of O-rings or the like interposed therebetween. Also, suitable flow blocking means 22 are provided in the manifolds 17 to maintain the hot and cold water flows separate from one another, and as seen best in FIGS. 2, 4 and 5, inwardly extending nipples or fittings 23 and 24 are provided on the cold and hot water pipes 18 and 19, respectively, in opposed inwardly directed relationship toward one another.

The solar power units 12 each comprises a base 25 having an inlet bore 26 therein extending inwardly from one side edge of the base to the center thereof and then directly upwardly and opening through an upper surface 27 of the base. The inlet bore 26 communicates with an outwardly spiraling channel 28 which terminates adjacent the outer edge of the base in a downwardly projecting outlet bore 29, which terminates at its lower end in a laterally projecting passage 30 in diametrically opposed relationship and coaxial with the inlet bore 26. The fittings 23 and 24 on the water manifolds are rotatably received in the bores or passages 26 and 30 and are sealed relative thereto by means of O-rings or the like 31. An upstanding, annular wall 32 is on the upper surface of the base at the outer marginal edge thereof, and an annular groove 33 is formed in the upper surface spaced radially inwardly from the annular wall 32. An O-ring or other suitable seal 34 is positioned in the groove 33, and a disc-shaped solar cell 35 is positioned on the upper surface of the base 25 in overlying relationship to the spiral passage 28 and the O-ring 34, and is sealed relative to the base by means of the O-ring.

A substantially frusto-conically shaped solar concentrator 36 is supported on the base and has a radially inturned flange 37 on its lower end, which is bolted to the upstanding peripheral wall 32 by means of bolts or cap screws or the like 38, and the inwardly extending flange overlies the outer peripheral edge portion of the solar cell 35 to clamp it securely downwardly against the O-ring seal 34. A groove or channel 39 is formed in the upstanding annular wall 32 at one side of the base 25, and a suitable insulated electric lead 40 is disposed in the channel and has its inner exposed end 41 soldered or otherwise suitably secured in electrically conductive relationship with the undersurface of the solar cell 35. Similarly, at the diametrically opposite side of the solar power unit 12 the inturned flange 37 of the concentrator or cone 36 has an upwardly deformed portion 42 therein defining a channel in which another electrical conductor 43 is disposed, with its inner end 44 soldered or otherwise suitable secured in electrically conductive relationship with the upper surface of the solar cell 35.

A suitable lens 45 is suitably secured in the upper end of the frusto-conical concentrator 36 for concentrating the sun's rays on the solar cell 35.

The frame 11 is supported for pivotal movement about its longitudinal axis by means of trunnions or the like 46 and 47 suitably rotatably supported in journals or bearings 48 and 49 at the opposite ends of the frame medially the opposite sides thereof, respectively. Thus the frame 11 and the solar power units 12 carried thereby are pivotal about the longitudinal center axis of the frame to a plurality of positions, as seen in FIG. 1. As illustrated in full lines, the frame and the solar power units are shown in a position pointed at the sun during early morning, for example, and in phantom line at 10a, the frame and solar power units are shown in a position pointed at the sun at noontime, for example, and as shown in phantom line at 10b, the array is shown in a position whereat the solar power units are pointed toward the sun in the evening.

A hydraulic cylinder 50 or other suitable means is supported on a bracket or the like 51 on the uprights or base 13 and is connected with the frame 11 for moving the frame to its several pivoted positions, as shown in FIG. 1. A suitable solenoid valve or the like 52 is connected via a pair of supply conduits 53 and 54 with the cylinder 50 for controlling flow of water or other hydraulic fluid thereto from a supply pipe 55. A suitable timer mechanism 56 is connected with the solenoid valve 52 for operating the valve to move the frame and solar array to the various positions at appropriate times during the day. The timer could be operative to continuously move the platform at a slow rate of movement during the day, or it could be moved in increments, as desired.

In addition to pivoting movement of the frame, the solar power units are pivotally connected about two mutually perpendicular axes, as noted previously, and as seen best in FIG. 2, this is accomplished by pivoting movement of the water manifolds 17 about the bosses 20 and 21 at their opposite ends. This pivoting movement is accomplished by means of a suitable hydraulic cylinder or the like 57 connected with an elongate operating bar 58 which is pivotally connected in turn with a plurality of upstanding brackets 59 rigidly secured to the manifolds 17, whereby upon extension and retraction of the piston and cylinder 57 the bar 58 is reciprocated back and forth, thus rocking the arms 59 and causing the manifolds to pivot back and forth about the axes of fittings 15 and 16 at opposite ends of the frame. Also as noted previously, the solar power units 12 are mounted for pivotal movement about the axes of fittings 23 and 24, and in order to accomplish this movement, a hydraulic cylinder 60 is connected with a link 61 which is connected in turn with a crossbar 62 which has connected thereto a plurality of elongate actuating rods 63 extending the length of the frame and pivotally connected to each solar power unit 12 at one side thereof by means of a projecting lug 64 on the upper end portion of the frusto-conically shaped solar concentrators 36. A similar crossbar 65 is connected across the actuating rods 63 at the end of the frame opposite the cylinder 60. Thus, the solar power units are effectively ganged together for movement in unison upon actuation of the piston and cylinder assemblies 57 and 60. Cylinders 57 and 60 are controlled in response to the position of solenoid valves 66 and 67, respectively, which are controlled, in turn, by means of dummy solar power units or solenoid control cones 68 and 69, respectively, each of which has a frusto-conically shaped concentrator 36, just as in the solar power units 12, and a base 25. However, rather than the solar cells 35, these units 68 and 69 have suitable thermocouples or the like 70 properly spaced and positioned in the base 25 thereof and a shadow casting element 71 is suitably supported by means of a spider or the like 72 at the upper end of the cone 36, such that in a normal proper position with the cone pointed directly at the sun, all of the thermocouples 70 are in the shadow of the unit 71. However, whenever the cone 36 is not pointed directly at the sun, one or the other of the thermocouples will not fall within the shadow of member 71 and will thus be energized by the sun to cause operation or energization of the solenoids 66 and 67 in an appropriate direction to cause the cone to be pointed at the sun.

Thus, the directionally controlled array of solar power units according to the invention is automatically positioned in response to movement of the sun in order to maintain the solar collectors or cones thereof pointed directly at the sun at all times during daylight hours to maximize utilization of the sun's energy. Moreover, the heat energy generated from the solar-cells is utilized to heat water to produce either hot water or steam, depending upon the temperatures attained, and this heated water or steam may thus be utilized for work.

In FIG. 9 a modification of the invention is shown, and in this form of the invention a pair of upstanding masts or posts 73 and 74 comprise a frame in which the plurality of manifolds 17 are pivoted for supporting the solar power units 12 in a manner similar to that described in relation to FIGS. 1–8. The solar cells 35 in the solar power units 12 may be suitably electrically connected with a plurality of batteries or the like 75, if desired, for storing the electrical energy produced thereby for use during hours of darkness. The heated water or steam produced as a result of cooling the solar cells may be utilized to operate a steam driven electrical generator or the like 76, if desired.

As noted previously, the piston and cylinder assemblies may be driven or operated by means of the water supplied to the hydraulic system of the invention, or, if desired, they may be operated by means of oil or other suitable motive fluid. For example, they could be pneumatically operated, if desired.

It is apparent that a directionally controlled array of solar power units in accordance with the invention could be provided with hundreds of power units to thus produce large amounts of power in a relatively small amount of space, particularly in view of the use of lenses 45 to concentrate the sun's energy on the solar cells 35.

As this invention may be embodied in several forms without departing from the spirit or essential characteristics thereof, the present embodiment is, therefore, illustrative and not restrictive, since the scope of the invention is defined by the appended claims rather than by the description preceding them, and all changes that fall within the metes and bounds of the claims or that form their functional as well as conjointly cooperative equivalents are, therefore, intended to be embraced by those claims.

I claim:

1. A directionally controlled array of solar power units, comprising: a pivotal supporting frame; a plurality of solar power units pivotally mounted on the frame for pivotal movement about two mutually perpendicular axes; conduit means on the frame for flow of cold water to and hot water from each power unit; each power unit including a solar cell for direct conversion of solar energy into electrical energy; lens means on each power unit arranged to concentrate solar energy on the solar cell of that unit; said conduit means connected for flow of cold water in heat exchange relationship with the solar cells to cool the solar cells and heat the water, said hot water thus being available for work; each power unit further comprising a base having a top surface and a bottom surface, an inlet into said base and extending through said base and exiting outwardly through the top surface of the base, a serpentine, open fluid flow troughlike passageway defined in said base top surface and extending from the inlet and a passage extending from the passageway downwardly into the base and thence outwardly through said base, said solar cell overlying the passageway closing the open side thereof to confine fluid flow through the passageway with said fluid contacting one side of said solar cell; and control means connected with the power units and the frame to pivot the power units in response to the position of the sun to keep the power units pointed at the sun during hours of daylight.

2. A solar array as in claim 1, wherein the supporting frame is rectangular in shape and includes opposite ends and opposite sides, said frame comprising a plurality of joined together, elongate pipes, outwardly extending journals on the pipes at the opposite ends of the frames medially of the opposite ends supported in bearing means for pivotal movement of the frame from side to side about the longitudinal axis thereof, said conduit means including a plurality of pairs of spaced apart, parallel hot and cold water pipes extending parallel to the sides of the frame and substantially coextensive in length therewith, said pipes converging at their opposite ends and having projecting fittings thereon rotatably received in cooperating bosses on confronting inner surfaces of the opposite ends of the frame, whereby said hot and cold pipes are disposed in pairs and are pivotally supported at opposite ends of the frame for pivotal movement about axes extending parallel to the pivotal axis of the frame.

3. A solar array as in claim 1, wherein said control means includes a plurality of thermocouple means, means spaced from the thermocouple means normally shading the thermocouple means, said thermocouple means supported in a housing carried by the frame and movable with the power units, whereby the housing is oriented identically to the orientation of the power units, and power means connected with the frame and power units and responsive to energization of the thermocouple means to pivot the frame and power units to maintain the power units pointed at the sun and to maintain the thermocouples in the shade.

4. A solar array as in claim 2, wherein power means is connected with the frame and with the power units for pivoting the frame and power units to maintain the power units pointed at the sun during hours of daylight, said power means comprising hydraulic piston and cylinder assemblies and link means connected between the piston and cylinder assemblies and the frame and power units to pivot the frame and power units in response to extension and retraction of the piston and cylinder assemblies, said control means comprising solenoid valves connected between the pipes of the frame for receiving water therefrom and the piston and cylinder assemblies for controlling flow of water from the frame pipes to the piston and cylinder assemblies.

5. A solar array as in claim 4, wherein said control means comprises a housing mounted on the frame for movement in unison with said power units, a plurality of thermocouple means carried by the housing means and means carried by the housing means for shading the thermocouple means when the housing means and power units are pointed directly at the sun, such that when the power units and housing means are not pointed directly at the sun, one or more of the thermocouple means is exposed to the sun to thus energize the solenoid valve means to operate the piston and cylinder assemblies to orient the power units and housing means to maintain them pointed at the sun.

6. A solar array as in claim 1, wherein the solar cells are electrically connected with a plurality of storage batteries for storing electrical energy produced thereby during hours of daylight for subsequent use of the electrical energy during hours of darkness.

7. A solar array as in claim 6, wherein the hot water outlet from the power units is connected with suitable power means for producing work.

8. A solar array as in claim 5, wherein said base is substantially circular, and said inlet is defined on one side thereof and exits upwardly at the center thereof, and further wherein said fluid flow passageway is spiral shaped and has an exit passage adjacent the outer periphery of said base located diametrically opposite said inlet, and further including a conically-shaped solar concentrator supported on the base above the solar cell and having lens means carried thereby for concentrating the sun's energy on the solar cell to produce electrical energy therefrom, said cold water pipe connected with the inlet to the base for circulation of cold water into the base and through the spirally-shaped passageway to heat the water.

* * * * *